United States Patent
Chen et al.

(10) Patent No.: US 11,609,261 B2
(45) Date of Patent: Mar. 21, 2023

(54) WAFER INSPECTION SYSTEM AND WAFER INSPECTION EQUIPMENT THEREOF

(71) Applicant: CHROMA ATE INC., Taoyuan (TW)

(72) Inventors: Wei-Chih Chen, Taoyuan (TW); Ben-Mou Yu, Taoyuan (TW); Yi-Yen Lin, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 17/337,954

(22) Filed: Jun. 3, 2021

(65) Prior Publication Data

US 2022/0034956 A1  Feb. 3, 2022

(30) Foreign Application Priority Data

Aug. 3, 2020 (TW) ................................. 109126250

(51) Int. Cl.
*G01R 31/26* (2020.01)
*G01N 21/95* (2006.01)
*G01R 31/28* (2006.01)

(52) U.S. Cl.
CPC ..... *G01R 31/2601* (2013.01); *G01N 21/9501* (2013.01); *G01R 31/2887* (2013.01)

(58) Field of Classification Search
CPC ............ G01R 31/2601; G01R 21/9501; G01R 31/2887
USPC .................................................... 324/762.01
See application file for complete search history.

(56) References Cited

FOREIGN PATENT DOCUMENTS

| JP | H05198633 A | * | 8/1993 | ............. H01L 21/66 |
| JP | 2007019237 A | * | 1/2007 | ............. H01R 21/66 |

OTHER PUBLICATIONS

English Translation JPH05198633A Prober for Semiconductor Wafer (Year: 1993).*
English Translation JP2007019237A Probing Device for Double-Sided Light Emitting Element (Year: 2007).*

\* cited by examiner

*Primary Examiner* — Jermele M Hollington
*Assistant Examiner* — Courtney G McDonnough
(74) *Attorney, Agent, or Firm* — WPAT, PC

(57) ABSTRACT

A wafer inspection system and a wafer inspection equipment thereof are provided. The wafer inspection system includes a susceptor device, probe card, and bridge module. The susceptor device includes a susceptor unit for placing a wafer under test. The probe card includes a probing portion and conducting portion. The conducting portion is disposed at the periphery of the probing portion and has a contact surface. The bridge module includes transmission units extended upward, positioned adjacent to a wafer placement area, and coupled to the susceptor unit. When the probing portion comes into contact with a testing point of the wafer, the contact surface of the conducting portion gets coupled to the transmission units to transmit a test signal to the probe card via the transmission units and conducting portion and thus form a test loop. Thus, the test loop path can be shortened and the accuracy of signal transmission and inspection can be enhanced.

17 Claims, 10 Drawing Sheets

WAFER INSPECTION SYSTEM AND WAFER INSPECTION EQUIPMENT THEREOF

FIELD OF THE INVENTION

The present disclosure relates to semiconductor component inspection system and equipment and, more particularly, to a wafer inspection system for inspecting wafers and a wafer inspection equipment of the wafer inspection system.

DESCRIPTION OF THE PRIOR ART

The course of manufacturing semiconductor components is divided into two processes, namely the preceding process and the subsequent process. The preceding process essentially comprises wafer fabrication (wafer fab) and wafer probe. The subsequent process essentially comprises IC packaging and a test process inclusive of an initial test and a final test.

Wafer probing involves testing the electrical functions of the dies of the wafer to identify those dies with unsatisfactory electrical functions prior to IC packaging and thus preclude entry of the unsatisfactory dies into a back-end process, thereby reducing production cost.

In the course of wafer probe, a probe of a probe card comes into contact with a testing point (for example, a solder pad on each die) disposed on the wafer and adapted to serve as an input end, such that the probe inputs a test signal to the corresponding die to inspect the electrical status of the circuit and thereby distinguish good dies from bad dies. The bottom of the wafer serves as the ground end of each die. A carrier (for example, a copper disk) for supporting the wafer is capable of effectuating electrical conduction and thereby functioning as the common ground for the dies. Conventionally, the carrier is additionally connected to a cable. The other end of the cable is connected to the probe card, and thus a test loop is created, thereby allowing the dies on the wafer to be tested one by one.

However, for example, when the test performed on the dies requires using a short-pulse, high-current signal, which is a pulse signal with extremely short duration (for example, less than 1 µs) and extremely great current (for example, greater than 10 A). The path length of the test loop is not only crucial to the quality of test signals but also important to the accuracy of test results. Conventionally, the probe card and the carrier are connected by the cable to render the conduction path of the test loop long. However, the long conduction path of the test loop has disadvantages as follows: the material of the cable has undesirable effects on signals being transmitted; the longer the path of the test loop is, the more it is susceptible to the induction effect; thus, the short-pulse, high-current signal waveform undergoes severe deformation and distortion, thereby leading to inspection inaccuracy and even failure.

SUMMARY OF THE INVENTION

It is an objective of the present disclosure to shorten the path of a test loop.

Another objective of the present disclosure is to provide a path for a high-current test loop.

Yet another objective of the present disclosure is to reduce the degree of waveform distortion of a test signal and enhance the accuracy of a short pulse, high-current signal being transmitted along the test loop.

Still yet another objective of the present disclosure is to enhance the accuracy of wafer inspection.

In order to achieve the above and other objectives, the present disclosure provides a wafer inspection system comprising a susceptor device, a probe card, and bridge module. The susceptor device comprises a susceptor unit for placing a wafer under test and a wafer placement area defined on the susceptor unit. The probe card is configured to face the susceptor device. The probe card comprises a probing portion and a conducting portion. The conducting portion is disposed at the periphery of the probing portion and has a contact surface. The bridge module is configured to mount to the susceptor device. The bridge module comprises a plurality of transmission units extended upward, positioned adjacent to the wafer placement area, and coupled to the susceptor unit. When the probing portion of the probe card comes into contact with a testing point on the top surface of the wafer under test, the contact surface of the conducting portion gets coupled to at least one of the transmission units, such that a test signal outputted by the probe card passes through the wafer under test, propagates from the bottom surface thereof to the susceptor unit, and returns to the probe card via at least one of the transmission units and the conducting portion, thereby forming a test loop.

According to an embodiment of the present disclosure, the probe card further may comprise a substrate, and the conducting portion is a conductive layer disposed on the bottom surface of the substrate. According to an embodiment of the present disclosure, the conductive layer may have a through hole, and the probing portion protrudes from the through hole.

According to an embodiment of the present disclosure, the through hole of the conductive layer may be disposed at the central region of the conductive layer, and an extension length from the edge of the through hole of the conductive layer to the outer edge of the conductive layer is greater than or equal to the radius of the wafer under test.

According to an embodiment of the present disclosure, the bridge module may comprise a fixing member mounted on the susceptor device, and each of the transmission units may be disposed on the fixing member.

According to an embodiment of the present disclosure, the fixing member may be ring-shaped and surround the wafer placement area.

According to an embodiment of the present disclosure, each said transmission unit may be disposed in the susceptor unit and has an end protruding from an upper surface of the susceptor unit.

According to an embodiment of the present disclosure, each said transmission unit may be a resilient component.

According to an embodiment of the present disclosure, each said transmission unit may be a pogo pin.

According to an embodiment of the present disclosure, an end of each said transmission unit may be directly connected to the susceptor unit.

According to an embodiment of the present disclosure, the transmission units may be disposed at a periphery of the wafer placement area, wherein the conducting portion of the probe card is coupled to at least one of the transmission units when the probe card inspects testing points of the wafer under test one by one.

In order to achieve the above and other objectives, the present disclosure further provides a wafer inspection equipment for inspecting a wafer under test disposed on a susceptor device. The wafer inspection equipment comprises a probe card and a bridge module. The probe card comprises a probing portion and a conducting portion disposed at the periphery of the probing portion. The bridge module is configured to mount to the susceptor device. The bridge module comprises a plurality of transmission units extended upward, positioned adjacent to a placement position of the wafer under test, and coupled to the susceptor device. When the probing portion of the probe card comes into contact with the wafer under test, the conducting portion is configured to couple to at least one of the transmission units.

According to an embodiment of the present disclosure, the probe card may comprise a substrate, and the conducting portion is a conductive layer disposed on a bottom surface of the substrate, wherein a lateral side of the conductive layer may be configured to contact with an end of each said transmission unit.

According to an embodiment of the present disclosure, the substrate may have a window corresponding in position to the through hole, wherein a light emitted from the wafer under test can pass through the window and be received by a light detection equipment disposed at the top of the substrate.

Therefore, according to the present disclosure, a wafer inspection system and a wafer inspection equipment thereof have advantages described below. A probe card is moved, such that a probing portion gets coupled to a wafer under test. Thus, a conducting portion of the probe card gets coupled to the transmission units of a bridge module, allowing a conduction path to be created at the edge of a wafer placement area which the wafer under test is positioned within. Subsequently, a test signal transmitted from the probe card returns to the probe card via the bridge module and the conducting portion, so as to shorten the path of the test loop, enhance the accuracy of a test signal being transmitted, and enhance the accuracy of wafer inspection.

DETAILED DESCRIPTION OF THE EMBODIMENTS

Figure 1:
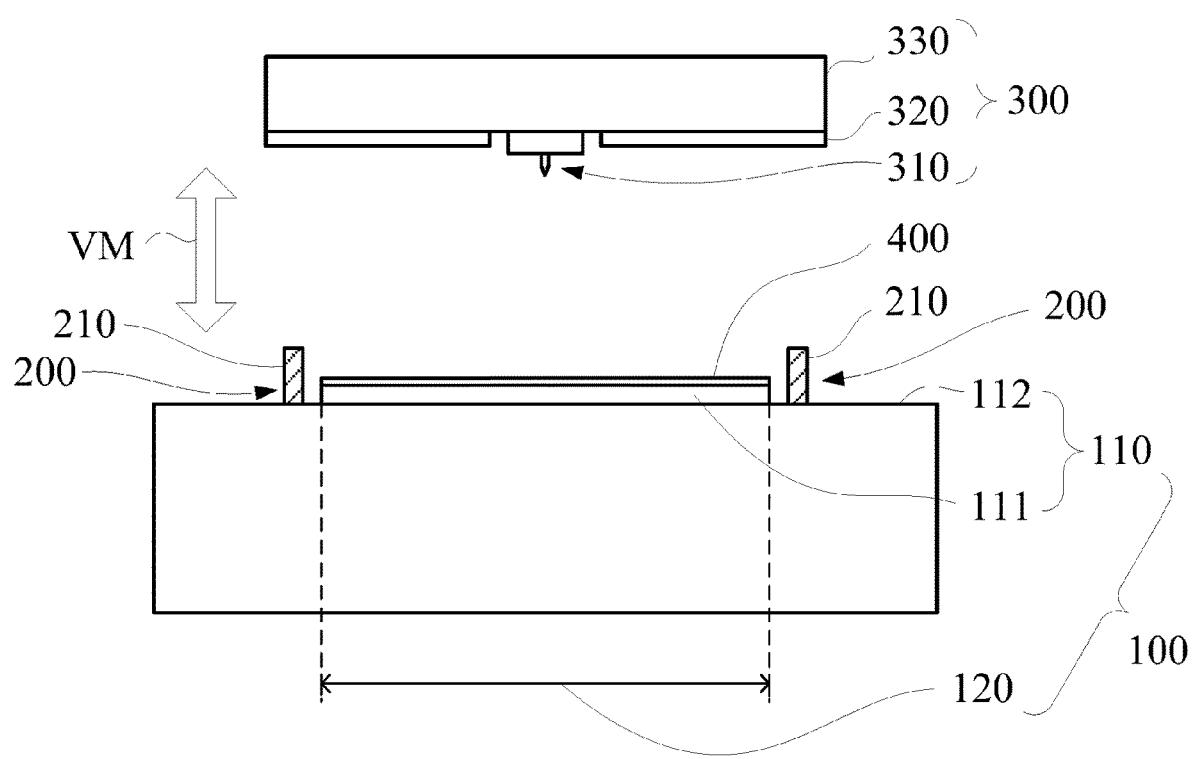
FIG. 1 is a lateral cross-sectional view of a wafer inspection system according to an embodiment of the present disclosure.

The technical characteristics, contents, advantages and effects of the present invention will become apparent from the following detailed description taken with the accompanying drawing.

Terms, such as "include", "comprise", "have" and the like, used herein are not restricted to essential elements disclosed herein; instead, the terms also apply to any other essential elements not definitely specified but inherently required for a unit, component, structure, device, module, system, region or zone.

Terms, such as "a", "an" and "one", are descriptive of a unit, component, structure, device, module, system, region or zone to serve an illustrative purpose and define the scope of the present disclosure. Thus, unless otherwise specified, the terms must be interpreted to also mean "one or at least one", and their singular forms may also be plural forms.

Units, components, structures, devices, modules, systems, regions and zones shown in the accompanying drawings are not drawn to scale. The drawing shown in the drawings is only an illustration, not a limitation.

Figure 2:
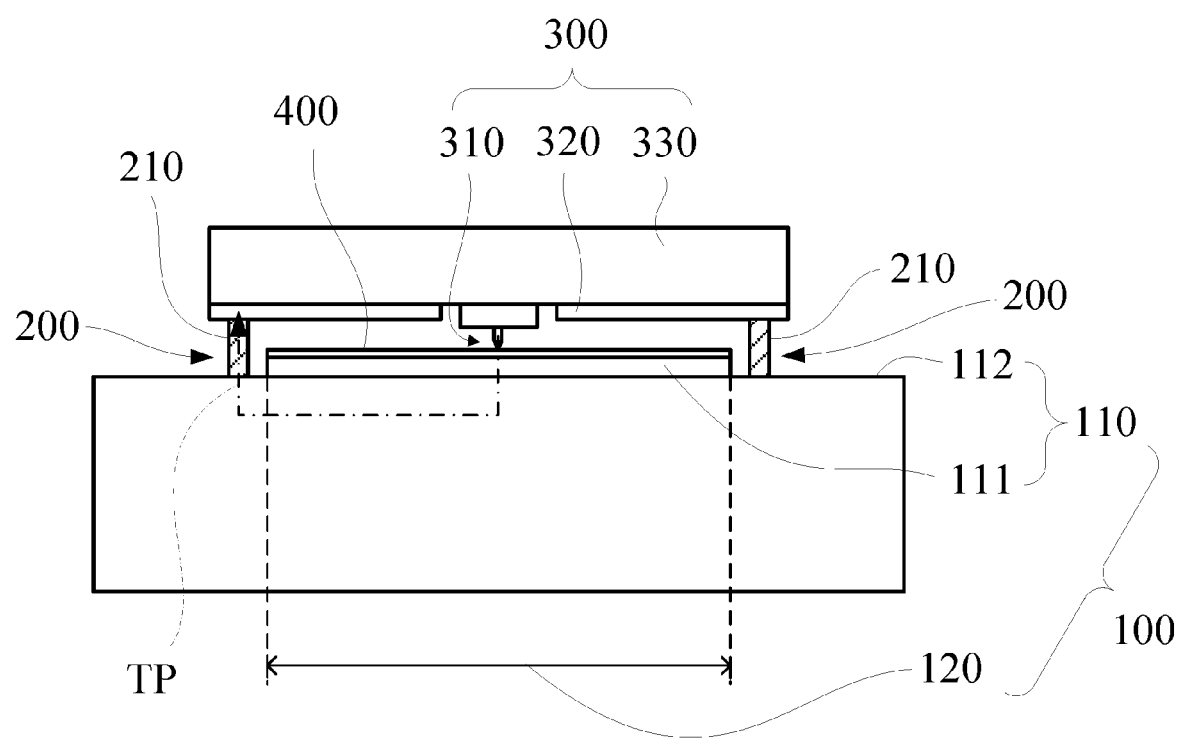
FIG. 2 is a schematic diagram of the embodiment illustrated by FIG. 1, showing a test loop.

Refer to FIG. 1 and FIG. 2. FIG. 1 is a lateral cross-sectional view of a wafer inspection system according to an embodiment of the present disclosure. FIG. 2 is a schematic view of the embodiment illustrated by FIG. 1, showing a test loop.

The wafer inspection system comprises a susceptor device 100, a probe card 300, and a bridge module 200 including a transmission unit 210. The bridge module 200 is configured to mount to the susceptor device 100. The bridge module 200 enables the susceptor device 100 and the probe card 300 to be coupled together, thereby providing a loop of electrical connection between the susceptor device 100 and the probe card 300. The bridge module 200 is either disposed on the susceptor device 100 or packaged together with the susceptor device 100.

The susceptor device 100 and the probe card 300 are configured to have a movable relationship with each other to a certain extent. Generally, the susceptor device 100 is driven, such that the testing point of a wafer gets closer to the probe card 300 to facilitate a probing step. However, the probing step in the aforesaid embodiment of the present disclosure is achieved by either moving the probe card 300 toward the wafer or moving both the susceptor device 100 and the probe card 300.

In the course of wafer inspection, the susceptor device 100 and the probe card 300 are generally configured to face to each other, thereby rendering a wafer 400 suitable for use in the probing step performed with the probe card 300. In the course of wafer inspection, the probe card 300 in operation lies above the susceptor device 100, and dies of the wafer 400 are inspected sequentially because of the movement of the susceptor device 100 and the probe card 300 relative to each other. Referring to FIG. 1, upon confirmation of the positions of the dies to be inspected, a coupling relationship is created between the susceptor device 100 and the probe card 300 and shown in FIG. 2 by means of vertical movement VM, thereby allowing a test loop TP to be created. After that, the probe card 300 performs various electrical tests, for example, under the control of a tester (not shown).

The susceptor device 100 comprises a susceptor unit 110 which the wafer 400 is disposed on and a wafer placement area 120 defined on the susceptor unit 110. The susceptor unit 110 is, for example, either a combination of a chuck 112 capable of clamping or suctioning and a carrier 111 for supporting a wafer or any other device or equipment for gripping or holding the wafer 400. Referring to FIG. 1 and FIG. 2, the susceptor unit 110 is, for example, a combination of the chuck 112 and the carrier 111. In a variant embodiment, one single chuck 112 or one single device or equipment is used to carry the wafer 400. Moreover, the carrying area of the carrier 111 is substantially greater than or equal to the area of the wafer 400. As shown in FIG. 1 and FIG. 2, for example, the carrying diameter of the carrier 111 is substantially equal to the diameter of the wafer 400.

The bridge module 200 comprises a plurality of transmission units 210 coupled to the susceptor unit 110. The transmission units 210 are extended upward and positioned adjacent to the wafer placement area 120. With the susceptor unit 110 being electrically conductive (for example, the supporting surface of the susceptor unit 110 is made of metal), the transmission units 210 are further coupled to the wafer disposed on the susceptor unit 110. The transmission units 210 are positioned adjacent to the wafer placement area 120. Therefore, the loop path between the susceptor device 100 and the probe card 300 can be shortened. Furthermore, the transmission units 210 may be positioned adjacent to the wafer placement area 120. However, in a variant embodiment, there may also be other objects between the transmission unit 210 and the wafer placement area 120.

The probe card 300 comprises a probing portion 310, a conducting portion 320 and a substrate 330. Upon completion of the alignment and movement steps in the inspection process, the probing portion 310 is in contact with a selected die to test, so as for a test signal to be transmitted to the die. The probing portion 310 shown in FIG. 1 and FIG. 2 is one single probe for illustrative sake. However, the present disclosure is not limited thereto. In a variant embodiment, the probing portion 310 is fixed to the substrate 330. The substrate 330 is usually configured in such a manner that various electronic components are disposed on its top surface, and related circuits are laid out on its top surface and in its interior, with an insulating layer disposed on its bottom surface.

In an embodiment, the bottom surface of the substrate 330 has a conducting portion 320, and the conducting portion 320 is disposed at the periphery of the probing portion 310. The conducting portion 320 disposed on the bottom surface of the substrate 330 is coupled to electronic components on the probe card 300 by the circuits laid out on and/or in the substrate 330, such that signals are sent back to related functional modules to facilitate a subsequent electrical analysis step. The conducting portion 320 is, for example, a conductive layer disposed on the bottom surface of the substrate 330 and is, for example, formed below the insulating layer; thus, a contact surface is formed on the bottom of the probe card 300 and adapted to be coupled to the transmission units 210.

The test loop TP includes a path whereby a test signal outputted by the probing portion 310 of the probe card 300 is passed through the dies of the wafer under test, transmitted from the bottom surfaces of the dies to the susceptor unit 110, transmitted by at least one said transmission unit 210 to the conducting portion 320 of the probe card 300, and finally returned to the probe card 300 to facilitate subsequent analysis.

Figure 3:
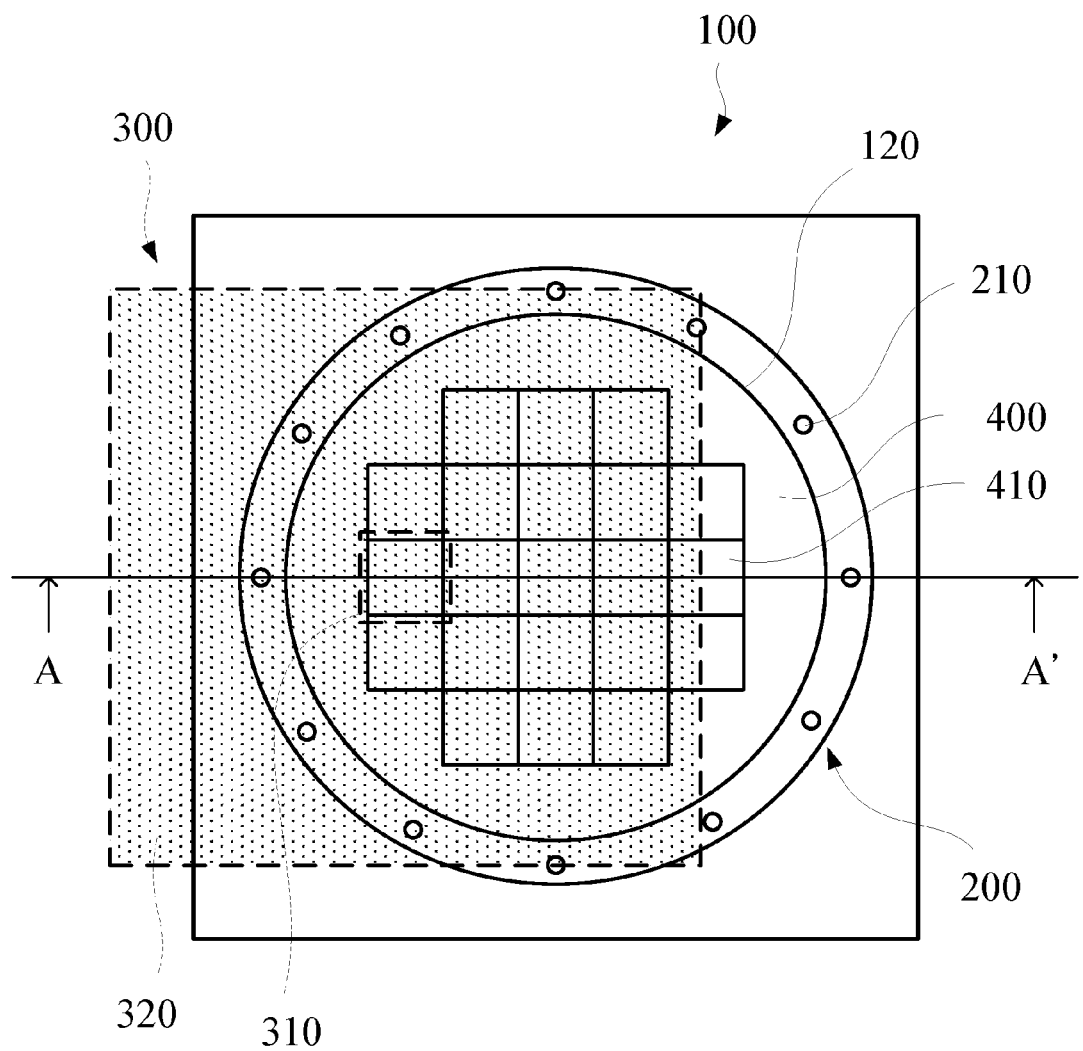
FIG. 3 is a schematic top view of the wafer inspection system of FIG. 1.
Figure 4:
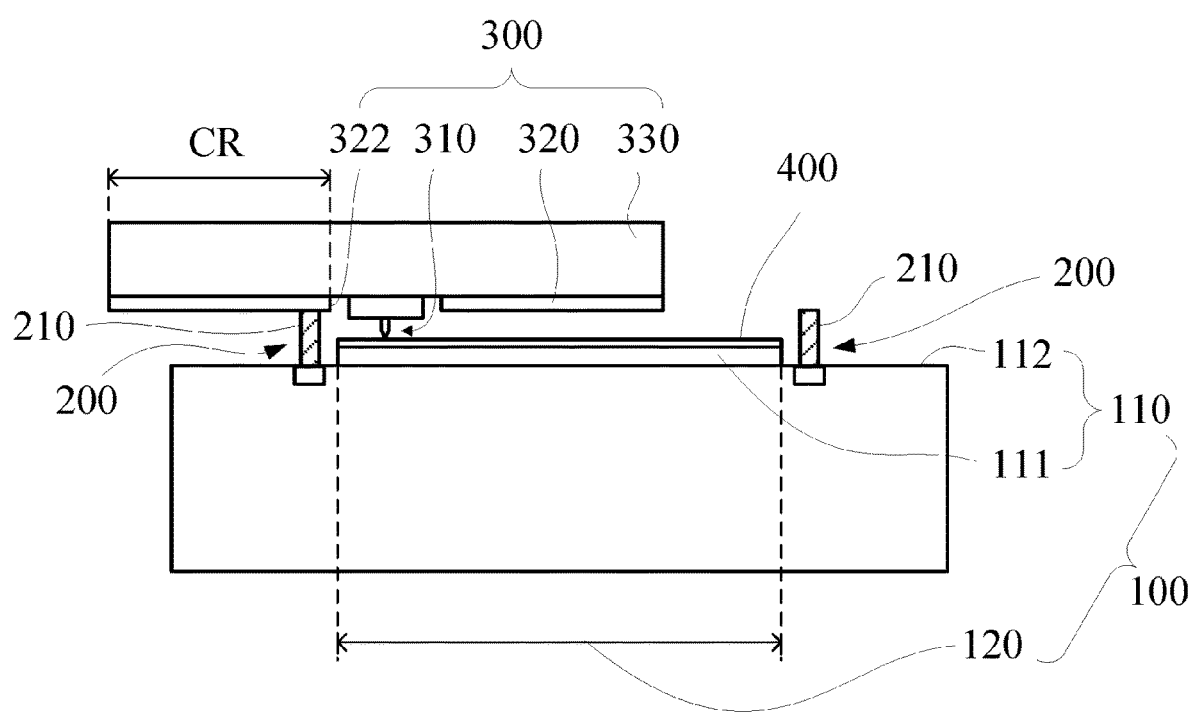
FIG. 4 is a cross-sectional view taken along line AA' of FIG. 3.

Refer to FIG. 3 and FIG. 4. FIG. 3 is a schematic top view of the wafer inspection system of FIG. 1. FIG. 4 is a cross-sectional view taken along line AA' of FIG. 3. As shown in FIG. 3, for illustrative sake, the probe card 300 is depicted with a dashed line. FIG. 3 shows that the probing portion 310 of the probe card 300 lies above the dies on the left of the wafer 400. Since the dies 410 are distributed across the wafer 400, the position of the probe card 300 relative to the wafer 400 varies from die to die. The conducting portion 320 is coupled to at least one of the transmission units 210 of the bridge module 200 while the probe card 300 is inspecting the dies 410.

In an embodiment, the least distance CR between the inner edge defined at the conducting portion 320 and positioned adjacent to the probing portion 310 and the outer edge of the conducting portion 320 is equal to at least the radius of the wafer 400. For example, in this embodiment, the conducting portion 320 has a through hole 322 which the probing portion 310 protrudes from. The extension length from the edge of the through hole 322 to the outer edge of the conducting portion 320 is greater than or equal to the radius of the wafer 400. In this embodiment, the probing portion 310 is substantially disposed at the central region of the conducting portion 320, whereas the area of the conducting portion 320 and the number of the transmission units 210 are uniformly distributed. However, the present disclosure is not limited thereto; thus, the conducting portion 320 can be of any shapes, provided that it is possible for the conducting portion 320 to be electrically connected to at least one said transmission unit 210 during the probing step. The greater the area of the conducting portion 320 is, the lesser is the number of the transmission units 210. The greater the number of the transmission units 210 is, the lesser is the area of the conducting portion 320 within a certain limit.

As shown in FIG. 4, the probe card 300 is on the left of the wafer 400. If the probe card 300 moves rightward, the transmission units 210 on the left will not be in contact with the conducting portion 320, but the transmission units 210 on the right will be effective in building an electrical conduction path.

The transmission units 210 are resilient components, which are capable of deforming (for example, are made of a deformable material) or capable of stretching (for example, are springs connected together). The transmission units 210 with the aforesaid physical properties provide a certain degree of additional connection length to ensure that the conducting portion 320 can be coupled to the transmission units 210. For instance, when the probe is in operation, the distance between the conducting portion 320 and the susceptor unit 110 is defined as a first length, and the actual length of the transmission units 210 is much greater than the first length. Thus, during the probing step, the coupling relationship between the conducting portion 320 and the transmission units 210 can be established.

Figure 5:
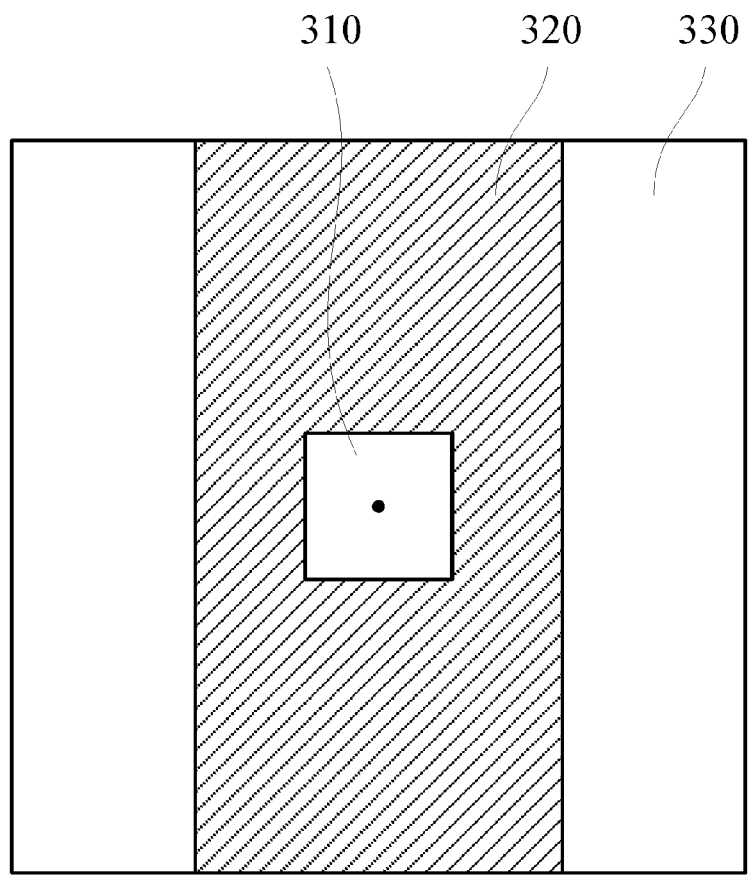
FIG. 5 is a bottom view of a probe card in an embodiment.
Figure 6:
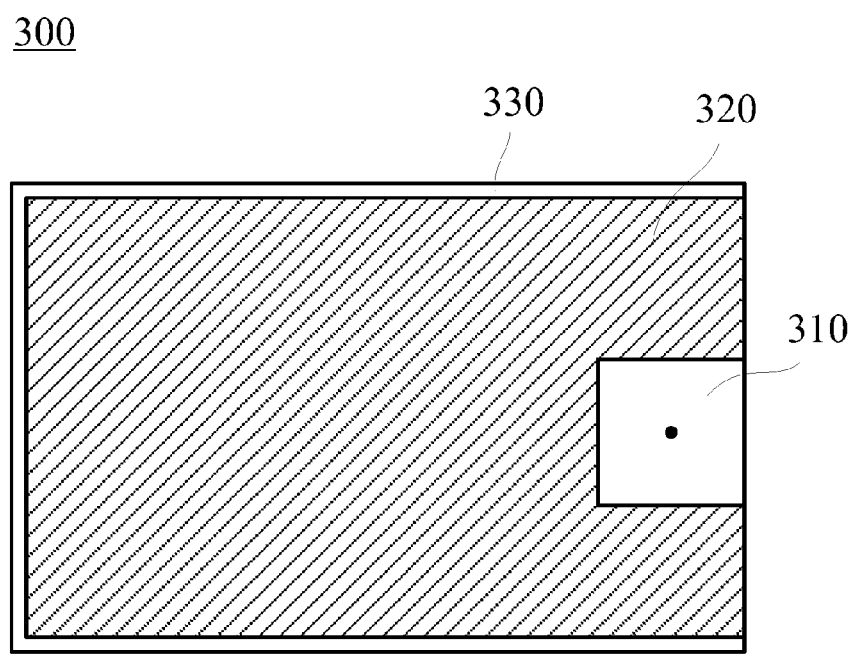
FIG. 6 is a bottom view of the probe card in another embodiment.

Refer to FIG. 5 and FIG. 6. FIG. 5 is a bottom view of a probe card in an embodiment. FIG. 6 is a bottom view of the probe card in another embodiment. As shown in FIG. 5 and FIG. 6, the conducting portion 320 disposed on the bottom surface of the probe card 300 can display variable patterns. Furthermore, the position of the probing portion 310 is variable.

As shown in FIG. 5, given an appropriate number of transmission units, the conducting portion 320 is variable in terms of distribution rather than restricted to full occupation of the bottom surface of the probe card 300. As long as the area of the probing portion 310 is appropriate for the number and position of the transmission units, the transmission units can still be coupled to the conducting portion 320 during the detection step performed on the different dies. FIG. 6 shows another configuration of the conducting portion 320, wherein at least one of the transmission units is coupled to the conducting portion 320 during the probing step.

Figure 7:
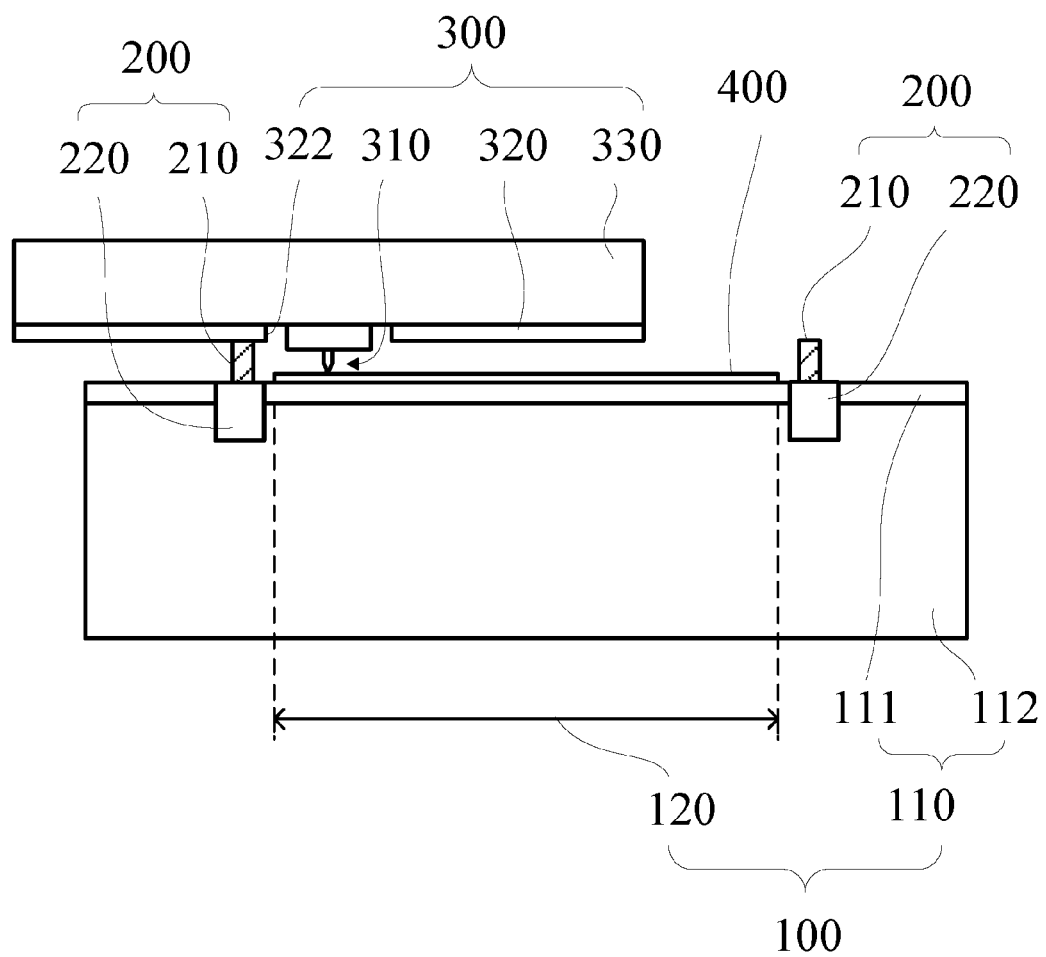
FIG. 7 is a lateral cross-sectional view of the wafer inspection system according to another embodiment of the present disclosure.
Figure 8:
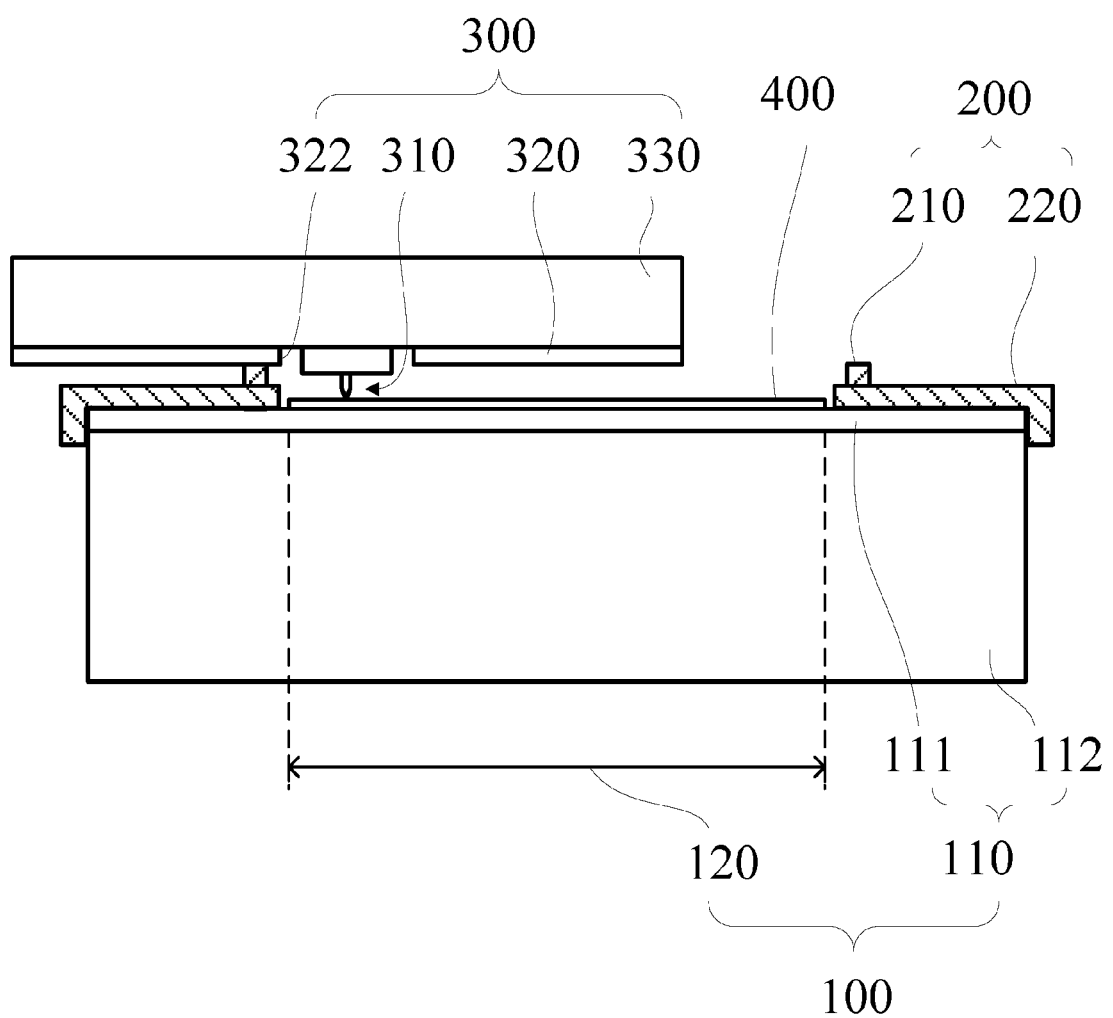
FIG. 8 is a lateral cross-sectional view of the wafer inspection system according to yet another embodiment of the present disclosure.

Refer to FIG. 7 and FIG. 8. FIG. 7 is a lateral cross-sectional view of the wafer inspection system according to another embodiment of the present disclosure. FIG. 8 is a lateral cross-sectional view of the wafer inspection system according to yet another embodiment of the present disclosure. The two embodiments together illustrate the difference in arrangement between the bridge module 200 and the susceptor device 100.

Referring to FIG. 7, the bridge module 200 is non-removably assembled together with the susceptor device 100. The bridge module 200 comprises a fixing member 220 mounted on the susceptor device 100. As shown in FIG. 7, the fixing member 220 penetrates the carrier 111 and the chuck 112 and is mounted in place therein. The transmission units 210 protrude from the surface of the susceptor device 100. With the fixing member 220, the transmission units 210 are electrically connected to the susceptor device 100 and the wafer 400 placed thereon. For example, one end of the transmission units 210 is directly connected to the susceptor unit 110.

Referring to FIG. 8, the bridge module 200 is removably assembled together with the susceptor device 100. The bridge module 200 comprises the fixing member 220 mounted on the susceptor device 100. The fixing member 220 is fixed to the susceptor device 100 with an engaging pin or an engagement element, or by compression, magnetic suction or any other means. With the fixing member 220, the transmission units 210 are electrically connected to the susceptor device 100 and the wafer 400 placed thereon. The embodiment illustrated with FIG. 8 is applicable to and thus can be appended to existing automated machines without affecting or impeding the placement process of the wafer 400. After the wafer 400 has been positioned in place, the bridge module 200 is mounted on the susceptor device 100 to operate in conjunction with the probe card of this embodiment, thereby building a short-path test loop.

Figure 9:
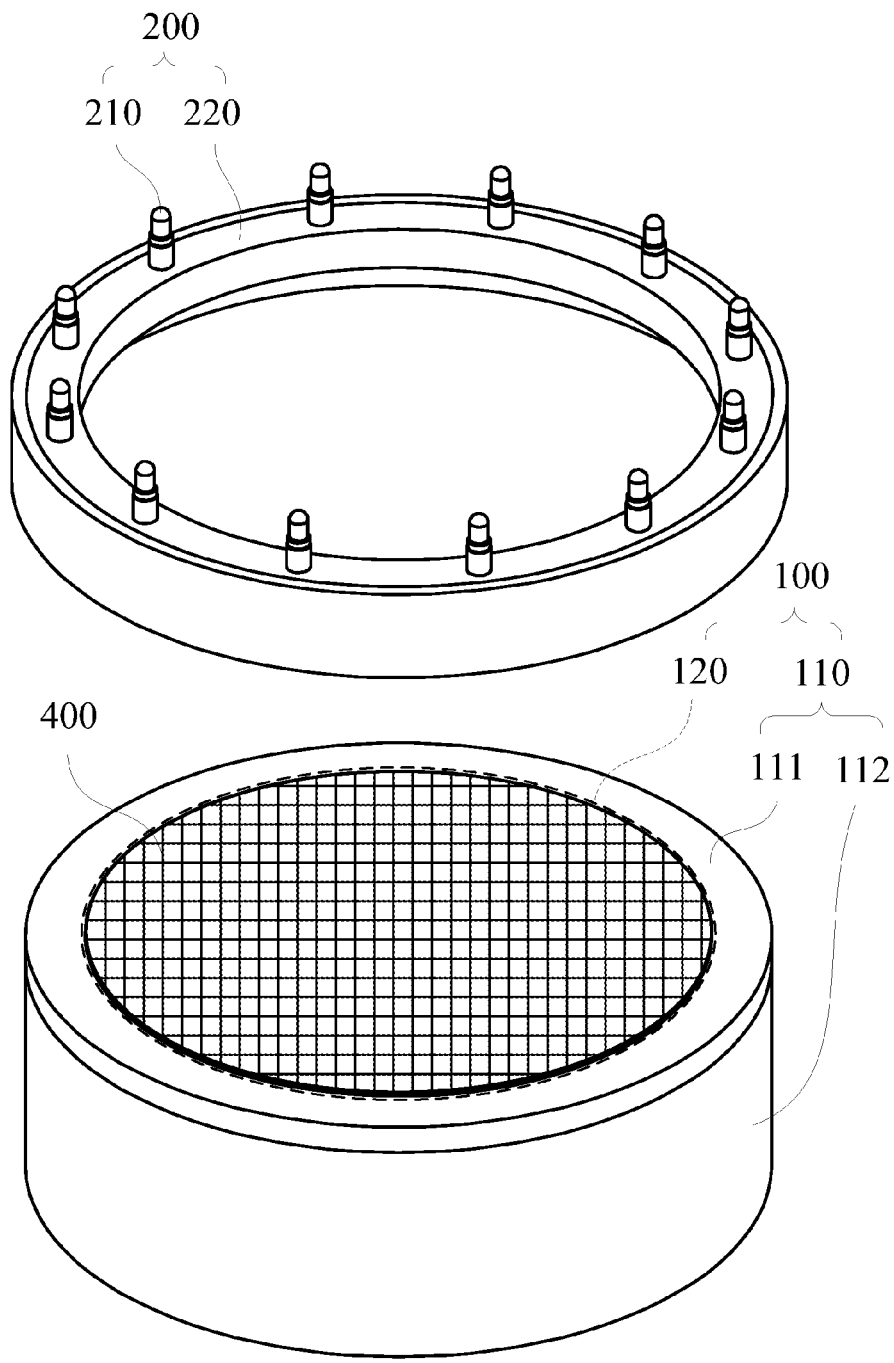
FIG. 9 is a partial perspective view of the wafer inspection system of FIG. 8 in part.

Referring to FIG. 9, there is shown a perspective view of the wafer inspection system of FIG. 8 in part. FIG. 9 shows the relationship between the susceptor device 100, bridge module 200 and the wafer 400. The transmission units 210 of FIG. 9 are exemplified by pogo pins. Referring to FIG. 9, the fixing member 220 mounted on the susceptor device 100 surrounds the wafer placement area 120 and thus is ring-shaped in accordance with the shape of the wafer 400. After the wafer 400 has been positioned within the wafer placement area 120, the removable bridge module 200 is mounted on the susceptor device 100.

Figure 10:
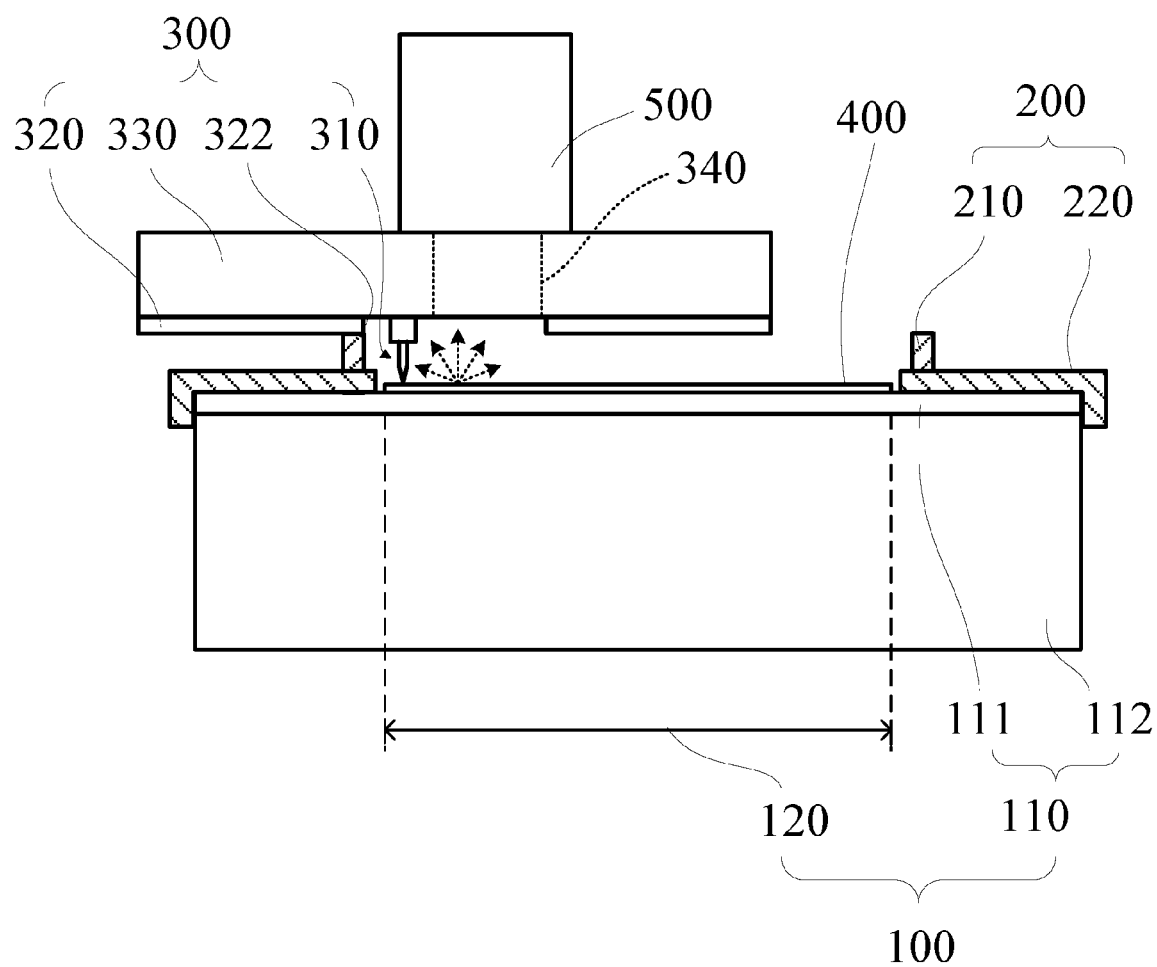
FIG. 10 is a lateral cross-sectional view of the wafer inspection system according to still yet another embodiment of the present disclosure.

Referring to FIG. 10, there is shown a lateral cross-sectional view of the wafer inspection system according to still yet another embodiment of the present disclosure. During a wafer test, the wafer under test is capable of emitting light. For example, if signal-receiving points of the dies receive a test signal, light will be emitted from light-emitting points of the dies. The signal-receiving points and the light-emitting points may be located at different positions of the dies. Referring to FIG. 10, the substrate 330 has a window 340 corresponding in position to the through hole 322. Light emitted by the dies passes through the window 340 and thus is detected by a light detection equipment 500 disposed on the other side (i.e., the top side) of the substrate 330. In other words, the central region of the probe card 300 is hollow because of the presence of the window 340, such that light generated by the wafer under test 400 being tested can be inspected by an optical test equipment mounted in place above the probe card 300.

Therefore, the technical feature (a conductive layer directly coated or an additional conductive layer disposed) on the bottom of a probe card, coupled with a bridge module, enables a test signal to return to the probe card via the transmission units of the bridge module and the conducting portion at the bottom of the probe card and thus form a test loop, thereby shortening the path of the test loop, enhancing the accuracy of signal transmission, and enhancing the accuracy of wafer inspection.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent changes and replacements made to the aforesaid embodiments shall fall within the scope of the present disclosure. Accordingly, the legal protection for the present disclosure shall be defined by the appended claims.

What is claimed is:

1. A wafer inspection system, comprising:
    a susceptor device comprising a susceptor unit for placing a wafer under test and a wafer placement area defined on the susceptor unit;
    a probe card configured to face the susceptor device and comprising a probing portion and a conducting portion, the conducting portion being disposed at a periphery of the probing portion and having a contact surface; and
    a bridge module comprising a fixing member and a plurality of transmission units disposed on the fixing member, the fixing member being configured to demountably mount to the susceptor device to thereby enable the bridge module to be mounted to the susceptor device after the wafer under test has been placed on the susceptor unit, allowing the transmission units to be coupled to the susceptor unit because of the bridge module mounted on the susceptor device,
    wherein, when the probing portion of the probe card comes into contact with a testing point on a top surface of the wafer under test, the contact surface of the conducting portion gets coupled to at least one of the transmission units, such that a test signal outputted by the probe card passes through the wafer under test, propagates from a bottom surface thereof to the susceptor unit, and returns to the probe card via at least one of the transmission units and the conducting portion, thereby forming a test loop.

2. The wafer inspection system of claim 1, wherein the probe card comprises a substrate, and the conducting portion is a conductive layer disposed on a bottom surface of the substrate.

3. The wafer inspection system of claim 2, wherein the conductive layer has a through hole, and the probing portion protrudes from the through hole.

4. The wafer inspection system of claim 3, wherein the through hole of the conductive layer is disposed at a central region of the conductive layer, wherein an extension length from the edge of the through hole of the conductive layer to the outer edge of the conductive layer is greater than or equal to the radius of the wafer under test.

5. The wafer inspection system of claim 3, wherein the substrate has a window corresponding in position to the through hole, wherein a light emitted from the wafer under test can pass through the window and be received by a light detection equipment disposed at the top of the substrate.

6. The wafer inspection system of claim 1, wherein a lower edge of the fixing member corresponds in shape to an upper edge of the susceptor device, allowing the fixing member to be fittedly mounted on the upper edge of the susceptor device.

7. The wafer inspection system of claim 6, wherein the fixing member is ring-shaped.

8. The wafer inspection system of claim 1, wherein each said transmission unit is a resilient component.

9. The wafer inspection system of claim 1, wherein each said transmission unit is a pogo pin.

10. The wafer inspection system of claim 1, wherein the transmission units are disposed at a periphery of the wafer placement area, wherein the conducting portion of the probe card is coupled to at least one of the transmission units when the probe card inspects testing points of the wafer under test one by one.

11. A wafer inspection equipment, for inspecting a wafer under test disposed on a susceptor device, the wafer inspection equipment comprising:
   a probe card comprising a probing portion and a conducting portion disposed at a periphery of the probing portion; and
   a bridge module comprising a fixing member and a plurality of transmission units disposed on the fixing member, the fixing member being configured to demountably mount to the susceptor device to thereby enable the bridge module to be mounted to the susceptor device after the wafer under test has been placed on the susceptor unit, allowing the transmission units to be coupled to the susceptor unit because of the bridge module mounted on the susceptor device,
   wherein the conducting portion is configured to couple to at least one of the transmission units when the probing portion of the probe card is in contact with the wafer under test.

12. The wafer inspection equipment of claim 11, wherein the probe card comprises a substrate, and the conducting portion is a conductive layer disposed on a bottom surface of the substrate, wherein a lateral side of the conductive layer is configured to contact with an end of each said transmission unit.

13. The wafer inspection equipment of claim 12, wherein the conductive layer has a through hole, and the probing portion protrudes from the through hole.

14. The wafer inspection equipment of claim 13, wherein the through hole of the conductive layer is disposed at a central region of the conductive layer, wherein the length from the edge of the through hole of the conductive layer to the outer edge of the conductive layer is greater than or equal to the radius of the wafer under test.

15. The wafer inspection equipment of claim 13, wherein the substrate has a window corresponding in position to the through hole, wherein a light emitted from the wafer under test can pass through the window and be received by a light detection equipment disposed at the top of the substrate.

16. The wafer inspection equipment of claim 11, wherein each said transmission unit is a resilient component.

17. The wafer inspection equipment of claim 11, wherein each said transmission unit is a pogo pin.

* * * * *